United States Patent
Byeon

(10) Patent No.: US 8,081,012 B2
(45) Date of Patent: Dec. 20, 2011

(54) SEMICONDUCTOR BUFFER CIRCUIT WITH VARIABLE DRIVING CAPABILITY ACCORDING TO EXTERNAL VOLTAGE

(75) Inventor: Sang Jin Byeon, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/649,125

(22) Filed: Dec. 29, 2009

(65) Prior Publication Data
US 2010/0308866 A1    Dec. 9, 2010

(30) Foreign Application Priority Data

Jun. 8, 2009    (KR) .................. 10-2009-0050351

(51) Int. Cl.
*H03K 19/094* (2006.01)
(52) U.S. Cl. ................. 326/86; 326/87; 326/34
(58) Field of Classification Search .............. 326/30–34, 326/82–83, 86–87; 327/108–112
See application file for complete search history.

(56) References Cited

U.S. PATENT DOCUMENTS

| | | | |
|---|---|---|---|
| 5,942,942 A | 8/1999 | Wang | |
| 5,999,032 A | 12/1999 | Wang et al. | |
| 6,329,843 B1 * | 12/2001 | Hirata et al. | 326/82 |
| 6,573,779 B2 | 6/2003 | Sidiropoulos et al. | |
| 6,636,098 B1 | 10/2003 | Kizer | |
| 7,161,513 B2 | 1/2007 | Werner et al. | |
| 7,269,212 B1 | 9/2007 | Chau et al. | |
| 7,352,207 B2 | 4/2008 | Garlapati et al. | |
| 7,542,507 B2 | 6/2009 | Sohn | |
| 2007/0089009 A1 | 4/2007 | Nishizawa | |
| 2008/0048778 A1 | 2/2008 | Lee et al. | |
| 2008/0303558 A1 * | 12/2008 | Rho | 327/108 |

FOREIGN PATENT DOCUMENTS

| | | |
|---|---|---|
| JP | 08-180688 | 7/1996 |
| KR | 10-0650847 B1 | 11/2006 |
| KR | 1020080062714 A | 7/2008 |

* cited by examiner

*Primary Examiner* — Shawki S Ismail
*Assistant Examiner* — Jany Tran
(74) *Attorney, Agent, or Firm* — William Park & Associates Ltd.

(57) ABSTRACT

A semiconductor buffer circuit that operates stably against PVT fluctuation is disclosed. The disclosed semiconductor buffer unit of the present invention includes: a detecting block configured to generate a plurality of code signals by detecting an external voltage, using a plurality of reference voltages; and a buffer unit configured to receive an input signal and the plurality of code signals and, based on the code signals, to generate an output signal, wherein a consumption of a driving current of the buffer unit is controlled based on the code signals.

6 Claims, 3 Drawing Sheets

SEMICONDUCTOR BUFFER CIRCUIT WITH VARIABLE DRIVING CAPABILITY ACCORDING TO EXTERNAL VOLTAGE

CROSS-REFERENCE TO RELATED PATENT APPLICATION

The present application claims priority under 35 U.S.C 119(a) to Korean Application No. 10-2009-0050351, filed on Jun. 8, 2009, in the Korean Intellectual Property Office, which is incorporated herein by reference in its entirety as if set forth in full.

RELATED ART OF THE INVENTION

1. Technical Field

Various embodiments of the present disclosure generally relate to a semiconductor buffer circuit, and more particularly, to a semiconductor buffer circuit that is controlled by an external voltage.

2. Related Art

Recently, integration levels of semiconductor memory devices have increased while driving voltages have decreased. Accordingly, much research has been conducted to achieve high-speed operation while using low driving voltages to activate circuits.

FIG. 1 shows a common buffer circuit. In particular, assume that the buffer circuit exemplified in FIG. 1 is a buffer that amplifies an input signal at an SSTL (Stub Series Terminate Logic) level into a CMOS level. Thus, this buffer exemplifies situations where the swing width of an input signal level is smaller than the swing width of an output signal level.

In FIG. 1, the buffer circuit includes first and second NMOS transistors NM1 and NM2 that receive a pair of input signals 'inb' and 'in', and first and second PMOS transistors PM1 and PM2 connected to a node 'A' that mirrors its current.

When an enable signal 'ENABLE' is activated, a third NMOS transistor NM3 is turned on and the buffer circuit starts and the potential difference between the input signals 'in' and 'inb' is detected by the first and second NMOS transistors NM1 and NM2. Accordingly, the first and second PMOS transistors PM1 and PM2 increase the amount of current by the potential difference, the voltage difference between V1 and V1B, and can provide an output signal 'out'.

On the other hand, when the buffer circuit is activated by a low driving voltage, a change in offset of the buffer circuit may be generated in accordance with PVT (Process, Voltage, Temperature).

For example, although threshold voltages of transistors are designed to be low to be suitable for a low-voltage environment, if threshold voltages of the first and second NMOS transistors NM1 and NM2 and the first and second PMOS transistors PM1 and PM2 have changed due to changes in process or voltage, full swing is not sufficiently at a CMOS level and an output signal 'out' may not be outputted at a desired level.

Accordingly, when the transistors are over-sized to improve current driving capability of transistors to prevent this problem, excessive current consumption may occur in a high-voltage environment.

SUMMARY

Accordingly, there is a need to overcome one or more of the problems discussed above. Therefore, various embodiments of the present invention may provide a semiconductor buffer circuit and an associated driving capability which is controlled based on a detected external voltage.

To attain the advantages and in accordance with the purposes of the invention, as embodied and broadly described, on exemplary aspect of the invention may provide a semiconductor buffer circuit comprising: a detecting block configured to generate a plurality of code signals by detecting an external voltage, using a plurality of reference voltages; and a buffer unit configured to receive an input signal and the plurality of code signals and, based on the code signals, to generate an output signal, wherein a consumption of a driving current of the buffer unit is controlled based on the code signals.

In another aspect, a semiconductor buffer circuit comprises: a buffer unit configured to buffer an input signal; and a detecting block configured to generate a plurality of code signals, wherein a driving capability of the buffer unit is changed based on a combination of the plurality of code signals, and the combination of the plurality of code signals varies in accordance with a fluctuation of an external voltage to the semiconductor buffer circuit.

In still another aspect, a semiconductor buffer circuit comprises: a detecting block configured to provide a plurality of pull-up and pull-down code signals by detecting fluctuation of an external voltage; and a buffer unit configured to amplify and provide an input signal by using the pull-up and pull-down code signals, wherein the buffer unit is controlled based on the pull-up and pull-down code signals such that driving capability according to fluctuation of the external voltage is compensated.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION OF THE EMBODIMENTS

Figure 1:
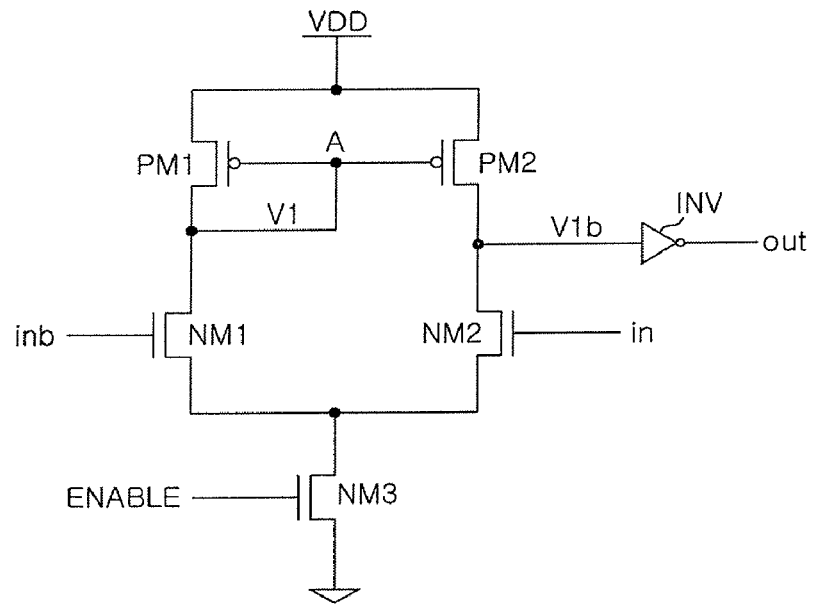
FIG. 1 is a diagram showing a conventional buffer circuit.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 2:
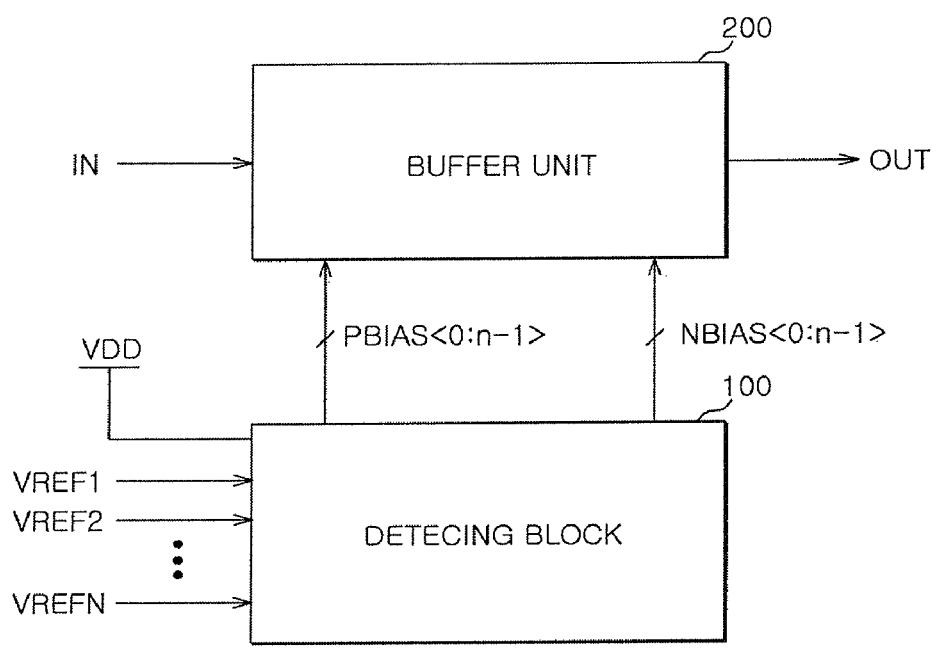
FIG. 2 is a block diagram showing an exemplary configuration of a semiconductor buffer circuit according to one embodiment.

FIG. 2 is a block diagram showing an exemplary configuration of a buffer circuit according to one embodiment.

Referring to FIG. 2, a buffer circuit includes a detecting block 100 and a buffer unit 200.

The detecting block 100 according to one embodiment detects changes in the external voltage 'VDD', using a plurality of reference voltages 'VREF1', 'VREF2' . . . , and provides pull-up code signals PBIAS<0:n−1> and pull-down code signals NBIAS<0:n−1>. For example, the detecting block 100 can detect in which voltage range the external voltage 'VDD' lies based on a plurality of reference voltages 'VREF1', 'VREF2', . . . and can provide the detected result as pull-up code signals PBIAS<0:n−1> and pull-down code signals NBIAS<0:n−1>. Accordingly, the detecting block 100 can change the driving capability of the buffer unit 200 by providing the pull-up code signals PBIAS<0:n−1> and the pull-down code signals NBIAS<0:n−1> which correspond to a voltage range containing the external voltage 'VDD'.

The buffer unit 200 provides an output signal 'OUT' at a CMOS level based on an input signal 'IN' at an SSTL level while being controlled by the pull-up code signals PBIAS<0:n−1> and the pull-down code signals NBIAS<0:n−1>. Since current consumption of the buffer unit 200 is controlled by the pull-up code signals PBIAS<0:n−1> and the pull-down code signals NBIAS<0:n−1>, the driving capability can be changed. This will be described in detail below.

Figure 3:
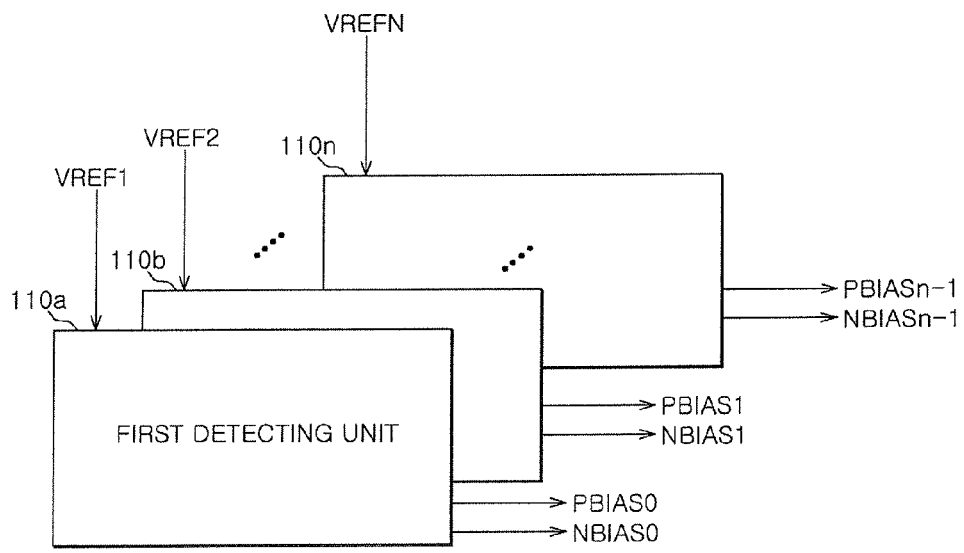
FIG. 3 is a conceptual block diagram showing an exemplary configuration of a detecting block shown in FIG. 2.

FIG. 3 is a block diagram showing an exemplary configuration of a detecting block 100 shown in FIG. 2.

Referring to FIG. 3, the detecting block 100 includes a plurality of detecting units 110a, 110b, . . . which receive different reference voltages VREF1, VREF2, . . . .

As described above, the detecting block 100 detects the external voltage 'VDD', using different reference voltages VREF1, VREF2 . . . , and provides pull-up code signals PBIAS<0:n−1> and pull-down code signals NBIAS<0:n−1>.

For example, a first detecting unit 110 provides first pull-up and pull-down code signals PBIAS<0> and NBIAS<0>, based on whether the external voltage 'VDD' detected based on whether the first reference voltage VREF1 is higher or lower than the first reference voltage VREF1.

Further, a second detecting unit 120 provides second pull-up and pull-down code signals PBIAS<1> and NBIAS<1>, based on whether the external voltage 'VDD' detected based on whether the second reference voltage 'VREF2' is higher or lower than the second reference voltage 'VREF2'.

Similarly, each of the detecting units 110a, 110b, . . . detects the external voltage 'VDD' using the corresponding reference voltages, and provide corresponding pull-up and pull-down code signals. Here, it is illustrated that the level is decreased step-wise from the first reference voltage 'VREF1' to the n-th reference voltage 'VREFn'.

Therefore, the detecting block 100 can detect the external voltage 'VDD', using the reference voltages 'VREF1', 'VREF2', . . . , such that it can provide corresponding pull-up and pull-down code signals.

When the external voltage 'VDD' is lower than a predetermined voltage, the first pull-up and pull-down code signals PBIAS<0> and NBIAS<0> activated by the first detecting unit 110 are provided, and the second pull-up and pull-down code signals PBIAS<1> and NBIAS<1> activated by an operation of comparison and detection of the second detecting unit 120 may be provided. That is, the lower the external voltage 'VDD' is, the bigger the number of the activated bits of the corresponding pull-up and pull-down code signals from the first detecting unit 110 to n-th detecting unit 1n0.

Accordingly, through the detecting block 100 according to one embodiment, the driving capability of the buffer unit (see '200' in FIG. 2) can be controlled by detecting changes in the external voltage 'VDD' and providing corresponding pull-up code signals PBIAS<0:n−1> and pull-down code signals NBIAS<0:n−1>.

This is described in detail with reference to FIG. 4.

Figure 4:
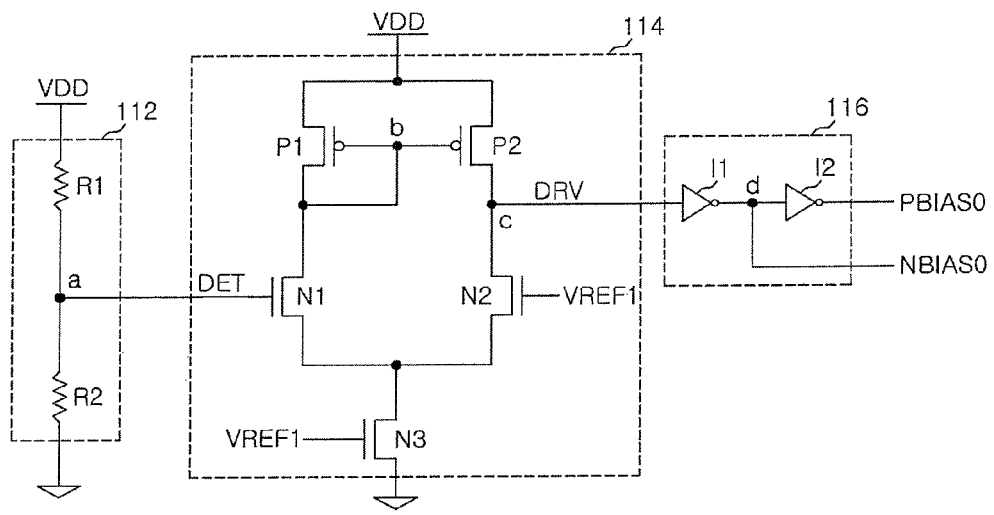
FIG. 4 is a circuit diagram showing an exemplary configuration of a first detecting unit shown in FIG. 3.

FIG. 4 is a detailed circuit diagram of the first detecting unit 110 according to FIG. 3. In order to avoid repeated description, the operation of detecting the external voltage 'VDD' is described by an example of the first detecting unit 110.

Referring to FIG. 4, the first detecting unit 110 includes a voltage sensing unit 112, a driving voltage generating unit 114, and an output unit 116.

The voltage sensing unit 112 includes first and second resistors R1 and R2, which are connected in series.

The voltage sensing unit 112 provides a sensed voltage 'DET' to a node a by distributing the external voltage WM, using the first and second resistors R1 and R2.

Each of the detecting area of the external voltage 'VDD' of the detecting units 110a, 110b, . . . (see FIG. 3) can be modified by adjusting the voltage distribution ratio by giving different specific resistance in the voltage detecting unit 112.

The driving voltage generating unit 114 generates a driving voltage 'DRV' based on the sensed voltage 'DET' and the first reference voltage VREF1.

The driving voltage generating unit 114 includes first to third NMOS transistors N1 to N3 and first and second PMOS transistors P1 and P2.

The first and second NMOS transistors N1 and N2 are disposed to face each other to receive the sensed voltage 'DET' and the first reference voltage 'VREF1', respectively. The first NMOS transistor N1 includes a gate receiving the sensed voltage 'DET', a drain connected to a node 'b', and a source connected to a third NMOS transistor N3. The second NMOS transistor N2 includes a gate receiving the first reference voltage VREF1, a drain connected to a node 'c', and a source connected to a third transistor N3. Although the first reference voltage VREF1 is not shown, it may be exemplified by a voltage signal that is generated to have relatively small change with respect to PVT from a reference voltage generator. Meanwhile, the third NMOS transistor N3 receives the first reference voltage VREF1 as an activation signal.

The output unit 116 includes first and second inverters I1 and I2.

The first inverter I1 receives a driving voltage 'DRV' and provides a signal at an inverted level as a first pull-down code signal NBIAS0.

The second inverter I2 inverts a signal of a node 'd' and provides it as a first pull-up code signal PBIAS0.

Next, the operation of the first detecting unit 110 is described in detail.

The first detecting unit 110 provides a sensed voltage 'DET' by distributing the external voltage 'VDD' using the first and second resistors R1 and R2. In this operation, if the external voltage 'VDD' is constant, the first and second resistors R1 and R2 are provided so that the sensed voltage 'DET' distributed by the first and second resistors R1 and R2 has substantially the same voltage as the first reference voltage VREF1.

Accordingly, it is possible to know if the external voltage 'VDD' is in a predetermined voltage range or not based on whether the sensed voltage 'DET' is higher or lower than the first reference voltage VREF1.

When the sensed voltage 'DET' is lower than the first reference voltage VREF1, the voltage of the node 'c' further decreases to generate a low level driving voltage 'DRV'. Accordingly, the first pull-up code signal PBIAS0 is provided at an activated low level and the first pull-down code signal NBIAS0 is provided at an activated high level.

If the sensed voltage 'DET' is higher than the first reference voltage VREF1, the voltage of the node 'b' is decreased more than the voltage of the node 'c', the second PMOS transistor P2 is turned on, and a driving voltage 'DRV' at a high level is generated. Accordingly, the first pull-up code signal PBIAS0 is provided at an inactive high level and the first pull-down code signal NBIAS0 is provided at an inactive low level.

As described above, the first detecting unit 110 detects the external voltage 'VDD', and when the external voltage is lower than the first reference voltage VREF1, generates code signals corresponding to the external voltage. In this configuration, the first pull-up code signal PBIAS0 and the first pull-down code signal NBIAS0 always have inverted levels. Accordingly, when the sensed voltage 'DET' is lower than the first reference voltage VREF1, the first pull-up code signal PBIAS0 and the first pull-down code signal NBIAS0 which have different logic levels are activated. In one embodiment of the present invention in particular, when the external voltage 'VDD' is a low voltage, a pull-down code signal, which has been activated to enhance the current sink capability of the buffer unit (see '200' in FIG. 2), is provided at an activated level. Thus, according to one embodiment of the present invention, characteristics of the minimum external voltage 'VDDmin' can be improved.

Though not described, the detecting units 110, 120, . . . according to FIG. 3, by a similar operational principle, provide code signals corresponding to the external voltage 'VDD' and provide the plurality of pull-up code signals PBIAS<0:n−1> and pull-down code signals NBIAS<0:n−1> to the buffer unit (see '200' in FIG. 2), such that the current sink capability can be variably controlled. In other words, when the external voltage 'VDD' is a low voltage, the numbers of activated signals of the pull-up code signals PBIAS<0:n−1> and pull-down code signals NBIAS<0:n−1> are increased. Accordingly, the current sink capability of the buffer unit (see '200' in FIG. 2) is enhanced, such that the driving force of the buffer unit (see '200' in FIG. 2) increases and it can be controlled to fully swing at a sufficient level.

Figure 5:
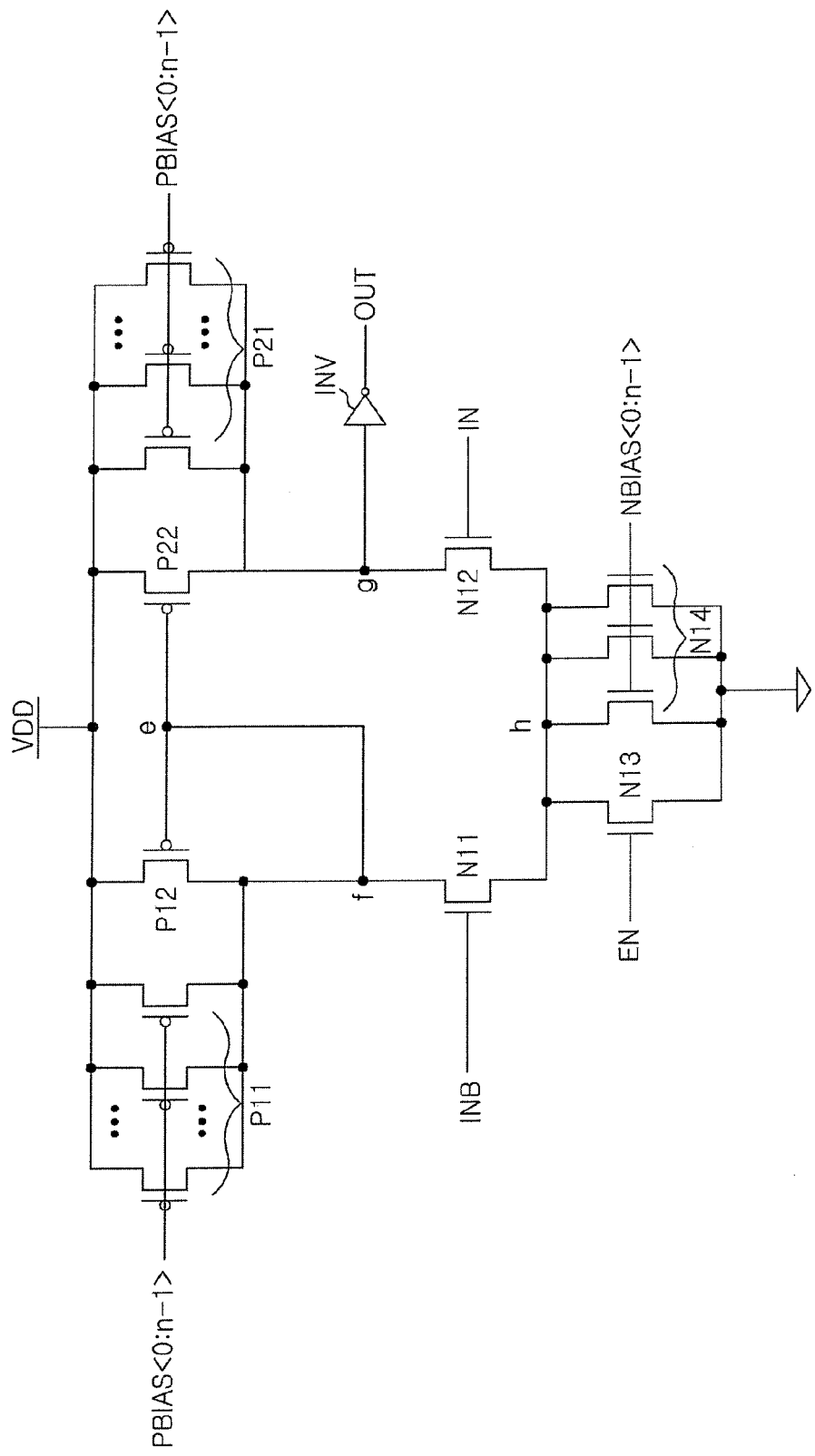
FIG. 5 is a circuit diagram showing an exemplary configuration of a buffer unit shown in FIG. 2.

FIG. 5 is a circuit diagram of the buffer unit 200 shown in FIG. 2.

Referring to FIG. 5, the buffer unit 200 includes a plurality of PMOS transistors P11 and P21 receiving a plurality of pull-up code signals PBIAS<0:n−1>, a plurality of NMOS transistors N14 receiving a plurality of pull-down code signals NBIAS<0:n−1>, first to third NMOS transistors N11 to N13, and first and second PMOS transistors P12 and P22 which perform the current mirroring.

The first and second NMOS transistors N11 and N12 each have a gate receiving inverted input 'INB' and input 'IN' signals at an SSTL level, a drain connected to nodes 'If' and 'g', and a source connected to a common node 'h'.

The third NMOS transistor N13 includes a gate receiving an enable signal 'EN', a drain connected to the node 'h', and a source connected to a ground voltage 'VSS'.

The plurality of NMOS transistors N14 each includes a gate receiving pull-down code signals NBIAS<0:n−1>, a drain connected to the common node 'h', and a source connected to a ground voltage 'VSS'. The NMOS transistors N14 can be turned on or off based on received pull-down code signals NBIAS<0:n−1>. The plurality of NMOS transistors N14 according to one embodiment is provided to increase the amount of tail current. The tail current is a DC current flowing to the ground voltage 'VSS' through the NMOS transistors N14. Accordingly, the current sink capability can be improved by the number of NMOS transistors N14 that are turned on based on the activated pull-down code signals NBIAS<0:n−1>.

On the other hand, a plurality of PMOS transistors P11 connected to the drain of the first PMOS transistor P12 each includes a gate receiving pull-up code signals PBIAS<0:n−1> a drain connected to the node 'f', and a source connected to the external voltage VDD'. The PMOS transistors P11 can be turned on or off based on received pull-on code signals PBIAS<0:n−1>.

Further, a plurality of PMOS transistors P21 connected to the drain of the second PMOS transistor P22 each includes a gate receiving pull-up code signals PBIAS<0:n−1>, a drain connected to the node 'g', and a source connected to the external voltage 'VDD'. The PMOS transistors P21 can be turned on or off based on received pull-up code signals PBIAS<0:n−1>. The exemplified plurality of PMOS transistors P11 and P21 are simply examples that control the driving capability of the transistors in accordance with the external voltage 'VDD', when the first and second PMOS transistors P12 and P22 have smaller size than the normal size, and this does not limit the scope and object of the present invention. That is, here, when the external voltage 'VDD' is lower than a predetermined voltage, for example, it is a low voltage, it is possible to improve the pull-up driving capability of the PMOS transistors based on the activated pull-up code signals PBIAS<0:n−1>, and when it is higher than the predetermined voltage, it is possible to reduce unnecessary current consumption based on the activated pull-up code signals PBIAS<0:n−1>.

Although the buffer unit 200 is provided with both of the plurality of PMOS transistors P11 and P21 receiving the plurality of pull-up code signals PBIAS<0:n−1> and the plurality of NMOS transistors N14 receiving the plurality of pull-down code signals NBIAS<0:n−1>, the present invention is not limited thereto. For example, it should be understood that the buffer unit 200 may be provided with only the plurality of NMOS transistors N14 receiving the plurality of pull-down code signals NBIAS<0:n−1>, without the plurality of PMOS transistors P11 and P21 receiving the plurality of pull-up code signals PBIAS<0:n−1>. The opposite configuration is also possible.

Describing the operation of the buffer unit 200, the inverted input 'INB' and input 'IN' signals at the SSTL level are provided. When the enable signal 'EN' is activated, the third NMOS transistor N13 is turned on and starts operating, the first and second NMOS transistors N11 and N12 detect a potential difference with respect to the pair of input signals 'IN' and 'INB', and the potential difference is current-mirrored by the first and second PMOS transistors P12 and P22. In this operation, according to an embodiment of the present invention, the number of NMOS transistors N14 that are turned on based on corresponding pull-down code signals NBIAS<0:n−1> changes in accordance with the sensed external voltage 'VDD'. The number of PMOS transistors P21 and P22 that are turned on based on pull-up code signals PBIAS<0:n−1> at inverted levels opposite to corresponding pull-down code signals NBIAS<0:n−1> also changes.

Therefore, when an external voltage 'VDD' under a predetermined voltage, that is, a low external voltage 'VDD' is applied, the number of PMOS transistors P11 and P21 and NMOS transistors N14 which are turned on in accordance with the number of activated pull-up code signals PBIAS<0:n−1> and pull-down code signals NBIAS<0:n−1> increases.

Therefore, the driving capability of the tail current from the PMOS transistors N14, which are pull-up transistors, to the NMOS transistors, which are pull-down transistors, is increased. Accordingly, it is possible to compensate the driving capability of the buffer unit 200 at a low voltage.

On the contrary, when the external voltage 'VDD' is higher than a predetermined voltage, the number of PMOS transistors P11 and P21 and NMOS transistors N14, which are turned on in accordance with combination of pull-up code signals PBIAS<0:n−1> and pull-down code signals NBIAS<0:n−1> of which the number of inactivated bits is increased, are reduced, such that the current sink capability of the tail current is considerably reduced. Therefore, it is possible to reduce unnecessary current consumption of the buffer unit 200, for a high voltage.

Generally, when a low voltage is applied by fluctuation of an external voltage 'VDD', the threshold voltages of the first and second NMOS transistors N11 and N12 and the first and second PMOS transistors P12 and P22 increase relative to a low external voltage 'VDD'. Accordingly, even if the first and second PMOS transistors N11 and N12 detect a potential difference with respect to the pair of input signals 'IN' and 'INB', it may be difficult for the first and second NMOS transistors P11 and P22 to fully amplify the potential difference. In a common buffer unit 200, the driving capability is remarkably reduced and it is difficult to provide an output signal 'OUT' at a desired level.

However, according to one embodiment of the present invention it is possible to control the amount of sink current to compensate for the driving capability of the buffer unit 200 in accordance with changes in the external voltage 'VDD'.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A semiconductor buffer circuit comprising:
   a detecting block configured to provide a plurality of pull-up and pull-down code signals by detecting fluctuation of an external voltage; and
   a buffer unit configured to amplify and provide input signals by using the pull-up and pull-down code signals,
   wherein the buffer unit is controlled based on the pull-up and pull-down code signals such that driving capability according to fluctuation of the external voltage is compensated,
   wherein the detecting block comprises a plurality of detecting units each receiving the external voltage and a corresponding one of a plurality of reference voltages, and at least two of the plurality of reference voltages are different from one another, and
   wherein the buffer unit comprises:
   a pull-up transistor unit configured to receive the pull-up code signals;
   a pull-down transistor unit configured to receive the pull-down code signals;
   a plurality of transistors configured to detect a potential difference of the input signals; and
   a current-mirror unit configured to amplify a current in accordance with the potential difference.

2. The semiconductor buffer circuit according to claim 1, wherein each of the detecting units provides corresponding pull-up and pull-down code signals by distributing the external voltage at different voltage distribution ratios with respect to the corresponding reference voltage.

3. The semiconductor buffer circuit according to claim 2, wherein the detecting unit comprises:
   a voltage sensing unit configured to provide a sensed voltage by distributing the external voltage at a predetermined distribution ratio by using a plurality of resistors connected in series;
   a driving voltage generating unit configured to generate a driving voltage by comparing the sensed voltage with the corresponding reference voltage; and
   an output unit configured to provide the pull-up and pull-down code signals having different logic levels in accordance with the driving voltage.

4. The semiconductor buffer circuit according to claim 3, wherein the driving voltage generating unit determines whether the sensed voltage is higher than the corresponding reference voltage, and provides activated pull-up and pull-down code signals, when the sensed voltage is lower than the corresponding reference voltage.

5. The semiconductor buffer circuit according to claim 1, wherein the amount of current for driving is controlled based on the pull-up and pull-down code signals in the buffer unit.

6. The semiconductor buffer circuit according to claim 5, wherein the amount of sinking current from the pull-up transistor unit to the pull-down transistor unit is increased based on the activated pull-up and pull-down code signals in the buffer unit, when the external voltage is lower than a predetermined voltage.

* * * * *